United States Patent
Beraud et al.

(10) Patent No.: US 8,802,982 B2
(45) Date of Patent: Aug. 12, 2014

(54) HOUSING CONSISTING OF SHELLS ASSEMBLED TOGETHER TO PROTECT AN ELECTRONIC DEVICE

(75) Inventors: Henry Beraud, Vincennes (FR); Patrick Corduan, Guignes (FR); Bernard Cuny, Verrieres le Buisson (FR)

(73) Assignee: Valeo Systemes Thermiques, Les Mesnil Saint Denis (FR)

(*) Notice: Subject to any disclaimer, the term of this patent is extended or adjusted under 35 U.S.C. 154(b) by 467 days.

(21) Appl. No.: 12/663,400

(22) PCT Filed: Jun. 12, 2008

(86) PCT No.: PCT/EP2008/057368
§ 371 (c)(1),
(2), (4) Date: Jul. 28, 2010

(87) PCT Pub. No.: WO2008/155283
PCT Pub. Date: Dec. 24, 2008

(65) Prior Publication Data
US 2010/0282506 A1 Nov. 11, 2010

(30) Foreign Application Priority Data

Jun. 12, 2007 (FR) ..................... 07 04172

(51) Int. Cl.
*H01R 13/46* (2006.01)
*H02G 3/18* (2006.01)
*H05K 5/00* (2006.01)

(52) U.S. Cl.
USPC .............. 174/59; 174/520; 361/730; 361/752

(58) Field of Classification Search
USPC .......... 174/35 R, 37, 38, 50, 51, 53, 52.1, 57, 174/58, 59, 60, 66, 67, 17 R, 17 CT, 101, 174/520; 220/3.2, 3.3, 3.8, 4.02, 4.21, 4.22, 220/4.24, 4.28, 4.29, 4.31, 3.92, 3.94, 220/345.1, 351, 241, 242, 327, 628, 630, 220/638, 668, 669, 675; 312/213, 223, 312/223.1, 223.2, 257.1, 263, 293.1, 293.2, 312/293.3, 244, 265.1–265.6, 328; 361/600, 641, 667, 683, 685, 724, 725, 361/726, 730, 735, 752, 679, 816, 818; 296/39.2; 439/135, 136, 607, 731, 696, 439/682, 137, 138; 52/3, 23

See application file for complete search history.

(56) References Cited

U.S. PATENT DOCUMENTS 3,629,901 A  12/1971 Wolf
4,703,160 A * 10/1987 Narishima et al. ............ 235/1 D
(Continued)

FOREIGN PATENT DOCUMENTS

EP  1 179 453 A2  2/2002
WO  00/76283 A1  12/2000

OTHER PUBLICATIONS

International Search Report w/translation from PCT/EP2008/057368 dated Dec. 3, 2008 (6 pages).

*Primary Examiner* — Hoa C Nguyen
*Assistant Examiner* — Binh Tran
(74) *Attorney, Agent, or Firm* — Osha Liang LLP

(57) ABSTRACT

The invention relates to a housing for protecting an electronic device (1) to be fitted to a motor vehicle, the housing comprising a plurality of shells (2, 3) forming a front (2) and a cap (3), these being assembled together to define jointly an enclosure (4) for housing an electronic card (1) provided with remote connectors (13), wherein at least one first shell (3) is formed from at least two elementary shells (18) and said first shell (3) includes, moulded into it, at least one mobility means allowing relative movement between the elementary shells. The first shell (3) is formed in one piece, the two elementary shells (18) are situated side by side, each comprising a window for the passage and/or reception of a connector (13), and said mobility means comprises an elastically deformable member (26).

14 Claims, 6 Drawing Sheets

(56) References Cited

U.S. PATENT DOCUMENTS

| | | | |
|---|---|---|---|
| 5,541,813 A | * | 7/1996 | Satoh et al. .................. 361/752 |
| 6,233,155 B1 | | 5/2001 | Moster et al. |
| 7,203,070 B2 | * | 4/2007 | Weisz-Margulescu et al. ............................ 361/752 |
| 2002/0028590 A1 | | 3/2002 | Saito et al. |

* cited by examiner

HOUSING CONSISTING OF SHELLS ASSEMBLED TOGETHER TO PROTECT AN ELECTRONIC DEVICE

TECHNICAL FIELD OF THE INVENTION

The field of the present invention is that of housings for protecting electronic devices to be fitted to a motor vehicle. The invention consists in a housing consisting of shells assembled together.

PRIOR ART

A motor vehicle is commonly equipped with a ventilation, heating and/or air conditioning installation the use of which is controlled by an electronic circuit card. This latter card is provided with connectors providing at least one electrical connection with equipment units of the installation, such as a fan or the like.

The electronic circuit card is accommodated inside a protective housing that consists of shells assembled together, for example a front and a rear closure cap. Each of the shells is produced by molding a rigid plastic material that has to be as economic as possible, such as polypropylene, possibly charged with talc, or an analogous plastic material susceptible to linear variations of length.

During assembly of the protection housing, the electronic circuit card is positioned precisely relative to a first shell, notably the front, and is retained on or fixed to the latter by clipping means or analogous assembly means. A second shell is also fixed by clipping means or analogous assembly means to the first shell and/or the electronic circuit card to enclose the latter card inside the protection housing. To enable an electrical connection between the electronic circuit card accommodated in the protection housing and the equipment units, the second shell includes windows for the connectors.

The general problem arises that assembling the shells together is required to be simple, fast and nevertheless robust. Moreover, assembling the shells together must not induce deterioration of the electronic circuit card and more particularly of the connectors received through the windows provided in the second shell. Reception of the connectors by the windows entailing close fitting of the connectors in the windows, assembling the shells together is difficult and can lead to their subsequent rejection because of deformation thereof, which it is desirable to minimize.

More particularly, a first problem that arises is that, connectors tending to have ever smaller dimensions, typically of the order of 0.6 mm×0.6 mm, retaining them in the windows necessitates increasingly precise alignment of the connectors with the windows.

A second problem that arises is that it is difficult and/or costly to mass-produce shells with strictly identical respective dimensions. More particularly, the dimensions of the windows and/or their respective positions are liable to vary significantly relative to set point values, this variation increasing in proportion to the distance between the connectors. Such variations either make it impossible to attach the second shell to the first shell and/or the electronic circuit card or lead to unseating or even deterioration of the connectors on fitting the second shell to the first shell. Also, the electronic circuit cards routinely used being provided with connectors with ever smaller dimensions, it follows that these connectors are more fragile, which increases the risk of unseating or even of deterioration of the connectors.

A third problem that arises is that the second shell and the electronic circuit card are produced from materials with respective coefficients of thermal expansion that are liable to be different. For example, the electronic circuit card is produced from an epoxy resin charged with glass fibers the coefficient of thermal expansion of which is less than that of the polypropylene charged with talc constituting the second shell. The housing is frequently placed in an environment subject to high variations of temperature, for example caused by solar radiation. A result of this is high antagonistic forces between the second shell and the connectors that are liable to cause deterioration of the latter connectors.

A fourth problem is that the protection housing is frequently subjected to vibrations that are liable to affect reception of the connectors by the windows.

OBJECT OF THE INVENTION

The aim of the present invention is to propose a protection housing for an electronic device produced by assembling shells together, the assembly together of the shells being robust, easy and fast to carry out, and/or in the event of significant thermal variations of the environment in which the protection housing is placed, and/or in the event of the protection housing being subjected to high vibrations, the fabrication costs of such a housing remaining low. When one of the shells includes at least one window through which is passed a connector with which the electronic device is provided, the present invention also aims to protect the connectors from risk of misalignment of the connector relative to the window and/or the risk of deterioration of the connector, in particular during assembly of the electronic device to the interior of the protection housing.

The housing of the present invention is a housing for protecting an electronic device to be fitted to a motor vehicle. The housing comprises shells assembled together.

According to the present invention, at least one first shell is formed from at least two elementary shells and said first shell has molded into it at least one mobility means allowing relative movement between the elementary shells.

These features are such that the elementary shells constituting the first shell are mobile relative to each other to facilitate assembly together of the first shell and at least one second shell. A further result of these features is that mechanical vibrations and/or differential expansion to which such a housing is liable to be subjected are without effect on the assembly of the shells together, thanks to the relative mobility means of the elementary shells. Such means enable relative movement of one elementary shell relative to another elementary shell to damp and/or compensate such vibrations and/or such expansion.

Assembly of the shells together is facilitated in the particular case where the first shell is provided with a window for an electric connector fastened to the electronic device. During assembly of the first shell with the second shell, alignment of the window facing the connector is obtained, if necessary, thanks to the use of the mobility means. Another result of these features is that differential thermal expansion of this electronic device and the first shell is compensated by loading the mobility means. This compensation protects the connector from high internal forces applied by the first shell to the connector and prevents it deteriorating. Similarly, vibrations to which the protection housing is liable to be subjected do not affect the electric connector thanks to the use of said mobility means.

It results further from these features that the first shell and the mobility means are produced simultaneously, without adding any additional part whatsoever and without any increase in fabrication cost relative to a first shell having no such means.

A final result of these features is that the first shell and the mobility means can be obtained by molding a plastic material of relatively low cost, such as a polycarbonate charged with talc, notwithstanding random shrinkage of the first shell during its fabrication, this shrinkage being easily and spontaneously compensated by deformation of the elastically deformable member.

The first shell is advantageously formed in a single piece. It follows that the elementary shells and the mobility means constitute a unitary one-piece assembly, the elementary shells and the mobility means being fastened together. These features are such that the first shell can easily be manipulated by an operator, in particular to assemble it to the second shell. The one-piece character of the first shell makes it easy to manipulate without affecting its structural integrity.

Said mobility means preferably comprise an elastically deformable member. Such an elastically deformable member is adapted to change its conformation because of the effect of forces that are applied to it and to return to its initial conformation when such forces are no longer applied to it, without its structural integrity being affected. Such conformation modification can be effected many times, the return to the initial conformation being obtained in a satisfactory manner each time.

The elastically deformable member advantageously comprises at least one pleat between the elementary shells.

The pleat is preferably the shape of the Greek letter omega ($\Omega$). Such a pleat is in particular conformed as a bridge with bent over edges. Such a pleat can easily be produced by molding it conjointly with the elementary shells that it separates from each other.

The mobility means are advantageously placed one third of the way along a length L of the first shell. These features are such that such a first shell is easy to manipulate when held by means of the elementary shell formed of two thirds of the first shell. The elementary shell formed of one third of the first shell does not tend to be folded against the other elementary shell under its own weight and by virtue of excessive deformation of the pleat. This finally makes assembling the shells together easy and fast.

The elementary shells are preferably provided with respective antagonistic abutment members opposing crushing of the pleat. Such features increase the ease of manipulating the first shell by preventing excessive crushing of the pleat.

Generally speaking, a result of the above features is that the elastically deformable member confers on the first shell mobility of the elementary shells relative to each other, placing the pleat one third of the way along the length L and the antagonistic abutment members retaining the elementary shells of the first shell relative to each other. These features constitute a compromise between obtaining an elastically deformable first shell, this deformability nevertheless not being excessive given the impossibility of easy manipulation of the first shell, or even excessive crushing of the elastically deformable member allowing deterioration of the electronic device.

There is preferably a stiffener flange in line with the corresponding antagonistic abutment member. These features aim to reinforce the structural integrity of the abutment units, which are liable to be deformed when they are used.

The elastically deformable member is preferably part of a back wall of the first shell. Such a back wall advantageously covering the electronic device to protect it, these features aim to facilitate movement of the elementary shells relative to each other in their own plane.

The elastically deformable member is preferably also part of a border wall of the first shell. To prevent distortion of the mobility of the elementary shells relative to each other, a border wall produced at the periphery of the back wall also includes an elastically deformable member that is preferably produced in a plane identical to that in which the elastically deformable member of the back wall is produced.

The border wall comprising at least two facing edges, a first edge preferably includes a first pleat facing a second pleat on the second edge.

The thickness of the pleat is preferably between 60% and 85% inclusive of the thickness of the wall in which it is formed. A result of these features is that the pleat is easily produced by reducing the thickness of the wall that includes it. Such a thickness reduction is in particular easy to achieve when producing the first shell by molding.

There being a plurality of pleats, two successive pleats are positioned head-to-tail relative to each other. The head-to-tail positioning of two successive pleats helps to prevent excessive deformation of the first shell as a result of high stretching and/or elongation of the pleat.

The electronic device is preferably an electronic circuit card for controlling the use of a ventilation, heating and/or air conditioning installation.

It will be noted that, without derogation from the rules of the invention as just set out, the electronic device can be any device, such as a car radio, a meter for displaying an operating parameter of the vehicle or the like.

DESCRIPTION OF THE FIGURES

The present invention will be better understood and relevant details thereof will become apparent on reading the following description of embodiments with reference to the figures of the appended drawings, in which:

In FIG. 1, a protection housing houses an electronic device 1, such as an electronic circuit card for controlling the use of a ventilation, heating and/or air conditioning installation of a motor vehicle. The housing consists mainly of a front 2 and a rear cap 3 that are assembled together to delimit conjointly an enclosure 4 inside which the electronic circuit card 1 is housed. The front 2 includes a front face 7 accessible to a user that is bordered by a peripheral wall 8. For its part, the rear cap 3 includes a back wall 5 at the periphery of which there is a border wall 6. The back wall 5 is of substantially rectangular shape with a length L and a width 1. The back wall 5 is equipped with ribs 27 in a cruciform arrangement that constitute stiffening elements of the back wall 5. These ribs 27 also constitute support elements for the electronic circuit card 1 inside the enclosure 4.

Figure 1:
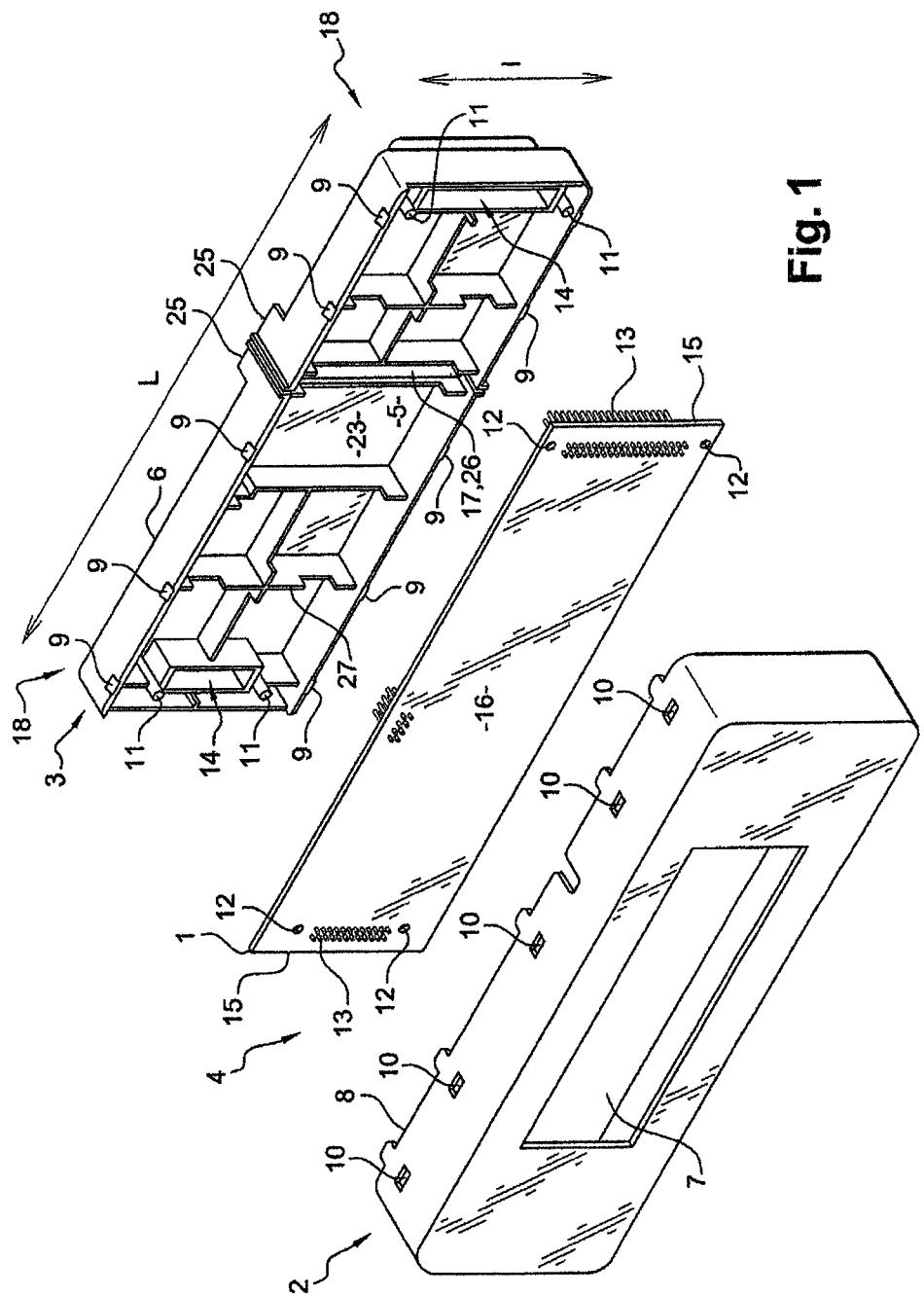
FIG. 1 is a diagrammatic exploded perspective view of a protection housing of the present invention.

When the electronic circuit card 1 is placed inside the enclosure 4, the electronic circuit card 1 is initially attached to the front 2 by means of fixing means of the clipping or analogous type. The rear cap 3 is then attached simultaneously to the front 2 and to the electronic circuit card 1 until the electronic circuit card 1 or the components that it carries abut against the ribs 27.

The border wall 6 is equipped with lugs 9 that cooperate nesting fashion with cut-outs 10 in the peripheral wall 8. The back wall 5 is equipped with nesting fingers 11 that cooperate with respective orifices 12 in the electronic circuit card 1. Such nesting fingers 11 position the rear cap 3 precisely relative to the electronic circuit card 1 when the rear cap 3 is placed on the electronic circuit card 1.

To enable an electrical connection between the electronic circuit card 1 and remote elements of the ventilation, heating and/or air conditioning installation, the electronic circuit card 1 is equipped with connectors 13, where appropriate formed as rows of pins. The back wall 5 is provided with windows 14 for the passage and/or reception of the connectors 13. It is routine in the field to place the connectors 13 on the electronic circuit card 1 at a distance from each other and more particularly along two spaced opposite edges 15 of the electronic circuit card 1. These features leave a central area 16 of the electronic circuit card 1 free for central electronic components that it carries, in particular a microprocessor.

When the electronic circuit card 1 is placed inside the enclosure 4, a three-fold positioning problem therefore arises, namely that of positioning the rear cap 3 relative to the front 2, that of positioning the rear cap 3 relative to the electronic circuit card 1, and that of positioning the latter card 1 relative to the front 2. To align the connectors 13 of the electronic circuit card 1 with the windows 14 of the rear cap 3, the latter cap 3 has molded into it at least one pleat 17 that constitutes an elastically deformable member 26 of the rear cap 3. It will be understood that the pleat 17 is molded at the same time as the rear cap 3 so that the pleat 17 and the rear cap 3 constitute a single one-piece part, produced in particular from plastic material. It will also be understood that the elastically deformable member 26 constitutes means for varying the dimensions of the back wall 5, namely its length L in the example shown. The elastically deformable nature of such a member 26 is obtained either by reducing the thickness of the back wall 5, in particular reducing it by 60% to 85%, or by producing the rear cap 3 using two different plastic materials. In this case, a rigid first plastic material forms elementary shells 18 constituting the back wall while the pleat 17 is produced from a second plastic material that is more flexible than the first. A two-material rear cap 3 of this kind is easily produced by a single molding step.

Figure 2:
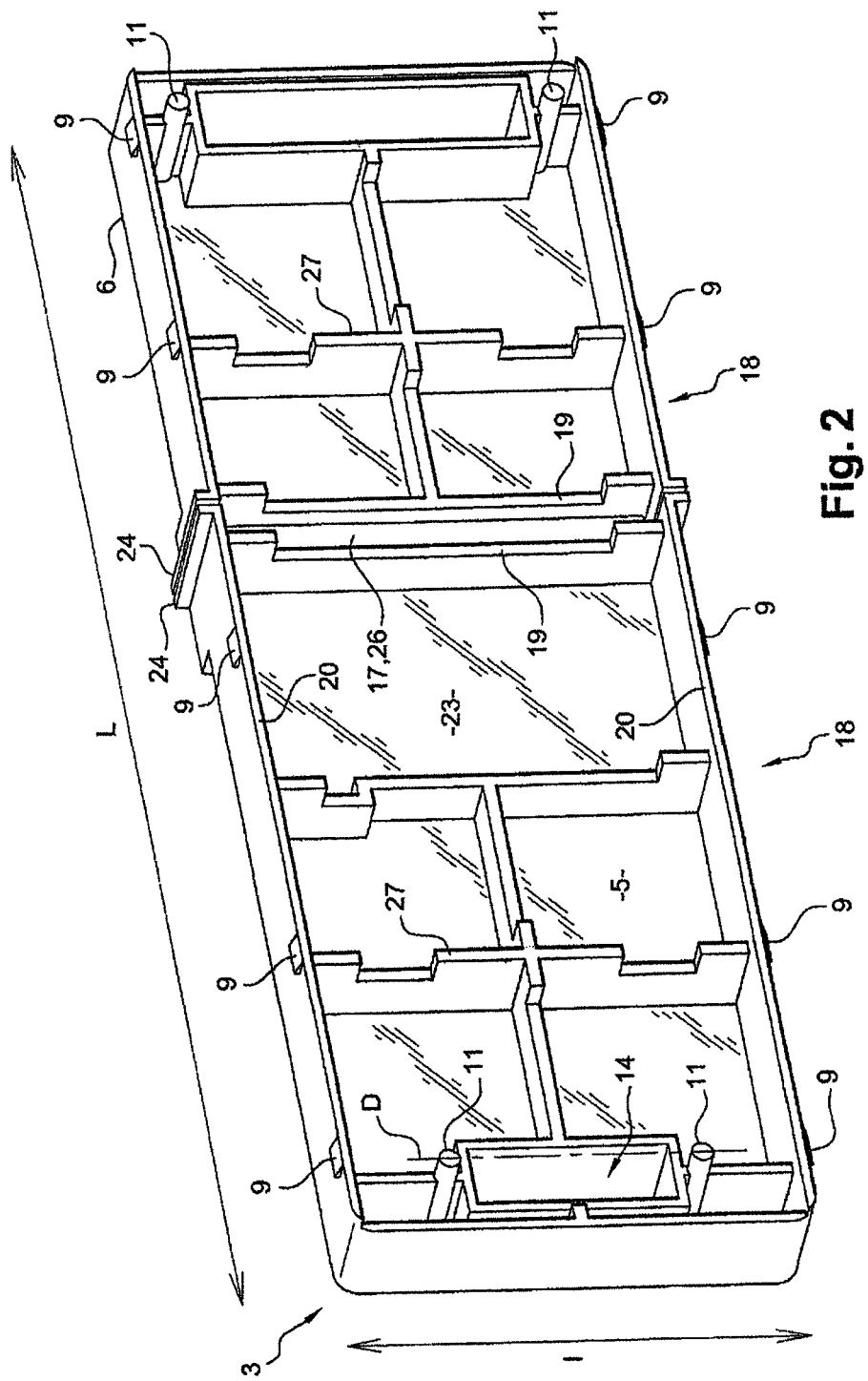
FIG. 2 is a diagrammatic perspective view of a rear cap of the housing shown in the preceding figure, this cap conforming to a first embodiment.
Figure 3:
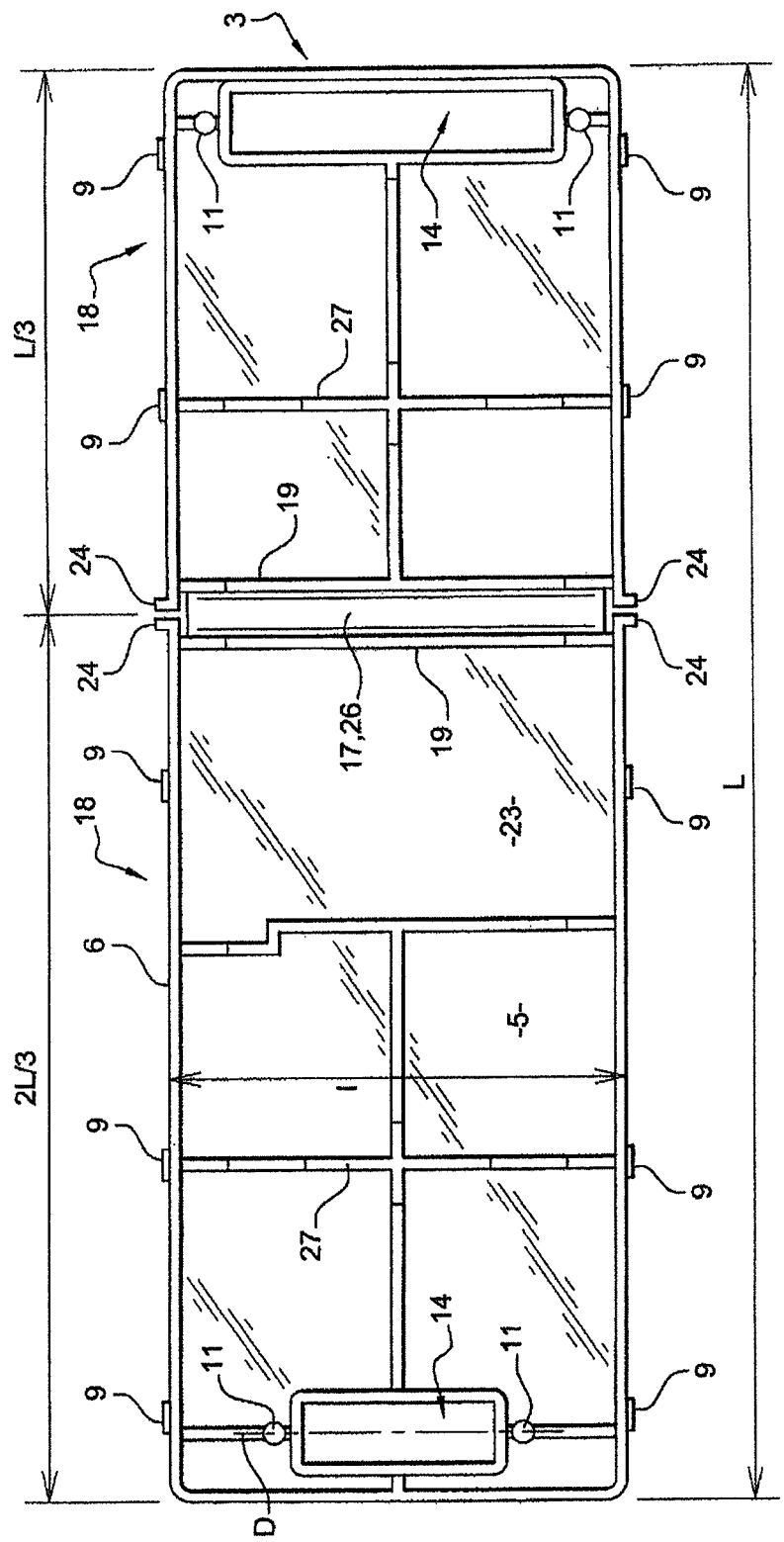
FIG. 3 is a diagrammatic front view of the rear cap shown in the preceding figure.

In FIG. 2 and FIG. 3, there is a pleat 17 in the back wall 5 parallel to the general direction D of the windows 14. The direction D is parallel to the direction of the width 1 of the back wall 5. The pleat 17 divides the rear cap 3 into two elementary shells 18 each of which includes a window 14. More particularly, the pleat 17 divides the back wall into two elementary shells 18 of different size, and in particular of different length. In a preferred embodiment of the present invention, the length of one elementary shell is of the order of twice the length of the other elementary shell 18. These features leave a central space 23 of the rear cap 3 free for housing in particular a microprocessor on the electronic circuit card 1.

The pleat 17 enables movement of the elementary shells 18 relative to each other. The pleat 17 is produced between two plates 19 fastened to the respective elementary shells 18. The plates 19 are arranged orthogonally to the back wall 5 and extend between two opposite edges 20 of the border wall 6.

Such plates 19 constitute structural reinforcements of the back wall 5 against which reinforcements the electronic circuit card 1 can abut when the electronic circuit card 1 is placed inside the enclosure 4. It will be noted that the pleat 17 extends over all the width 1 of the rear cap 3.

Figure 4:
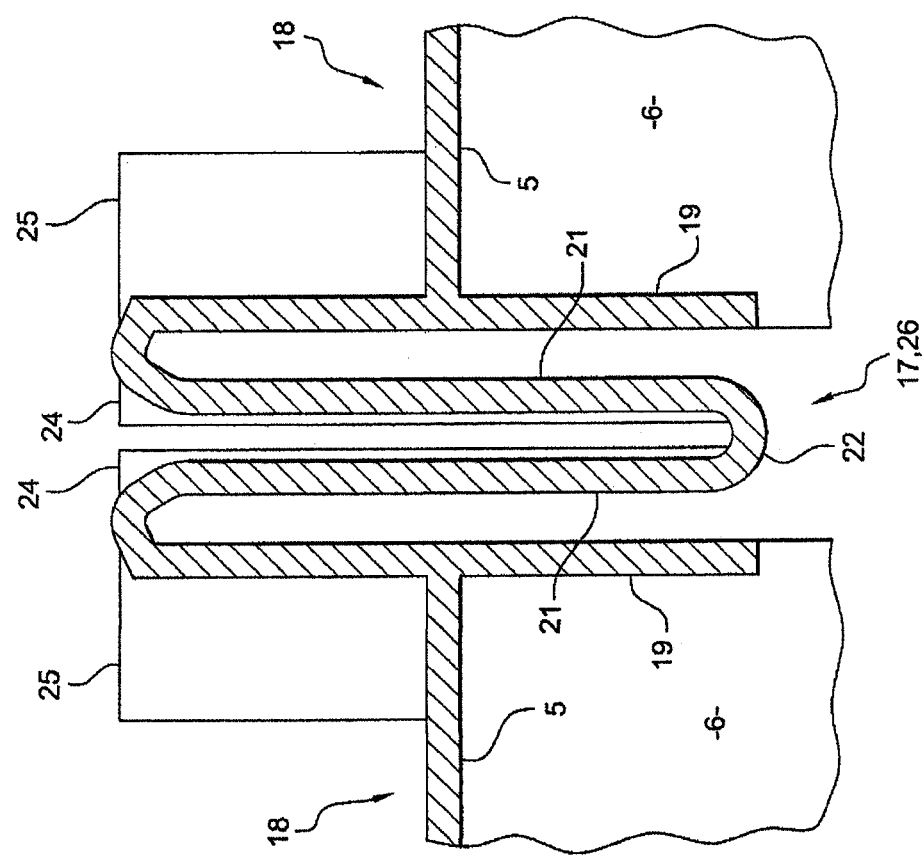
FIG. 4 is a diagrammatic partial view in section of the rear cap shown in FIGS. 2 and 3.

In FIG. 4, the pleat 17 is the shape of the Greek letter omega (Ω), including two legs 21 connected to the plate 19 of the respective corresponding elementary shell 18, the legs 21 of a pleat 17 being connected together by a summit 22 of the pleat 17. In another embodiment of the present invention, the legs 21 of the pleat 17 are connected directly to the back wall 5.

Each elementary shell 18 is equipped with antagonistic abutment members 24 opposing crushing of the pleat 17. Such abutment members 24 limit crushing of the pleat 17 on itself to prevent excessive deformation of the rear cap 3, which would be likely to prevent assembly of the rear cap 3 to the front 2 and/or to the electronic circuit card 1. If high forces are applied to the rear cap 3 to crush the pleat 17, the antagonistic abutment members 24 are in contact with each other so that the deformation of the rear cap 3 is contained within controlled proportions, which prevents it being impossible to use the rear cap 3 and deterioration of the latter cap 3.

In the embodiment shown in FIG. 2, each abutment member 24 consists of a return on the border wall 6 of the elementary shell 18 that is orthogonal to the border wall 6 and faces an antagonistic return provided on the border wall 6 of the other elementary shell 18.

In FIG. 3, each abutment member 24 consists of an extension of the border wall 6 of one elementary shell 18 in the direction of the border wall 6 of the other elementary shell 18.

In FIG. 4, each abutment member 24 is provided with a stiffener flange 25 that consists of an extension of the border wall 6.

Figure 5:
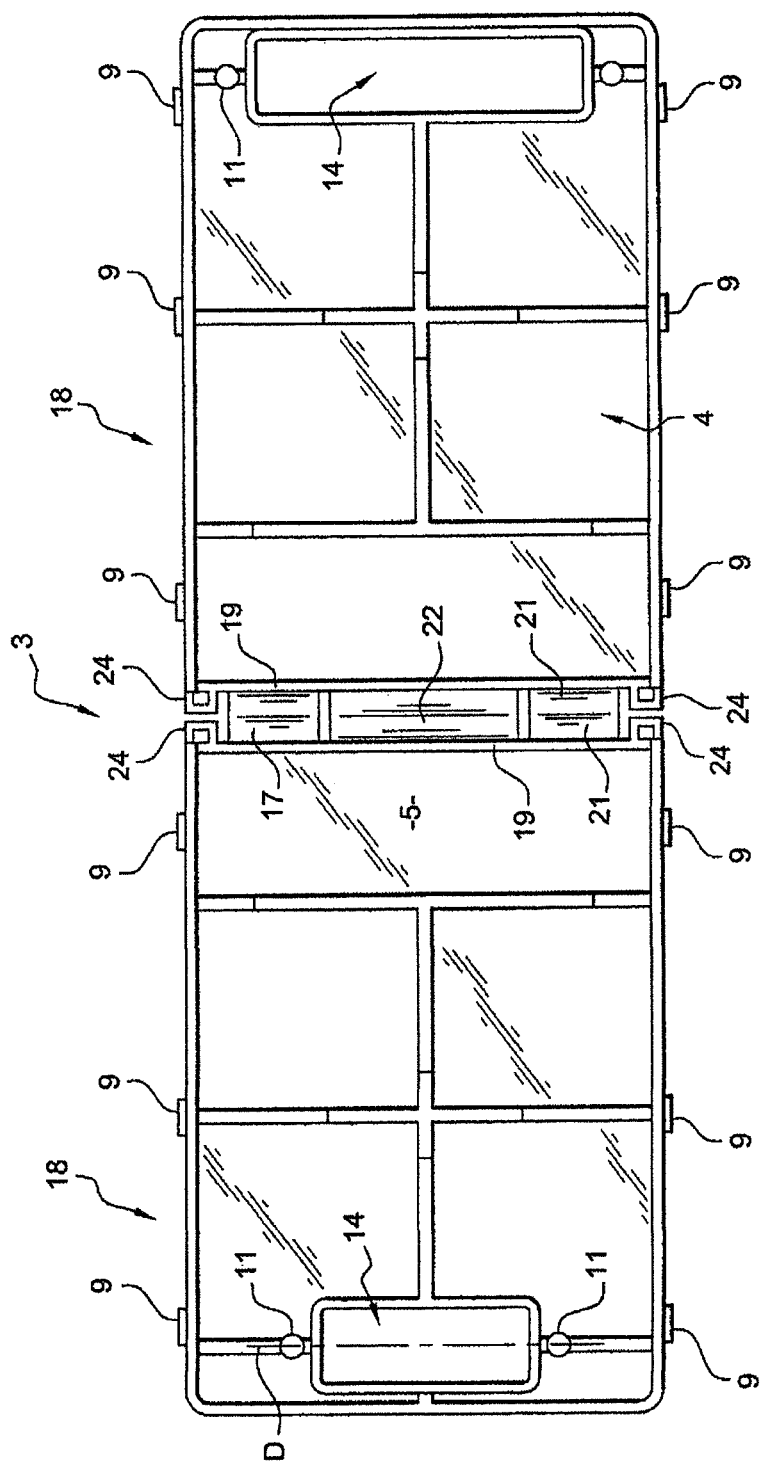
FIG. 5 is a diagrammatic front view of a rear cap of a second embodiment of the present invention.

In the second embodiment shown in FIG. 5, a plurality of pleats 17 is produced in the back wall 5 of the rear cap 3. To be more precise, the back wall 5 includes three successive pleats 17 that are aligned in the same direction parallel to the general direction D of the windows 14. Two successive pleats 17 are positioned head-to-tail relative to each other so that the summit 22 of a first pleat 17 is oriented toward the enclosure 4 whereas the summit 22 of a successive second pleat 17 is oriented toward the exterior of the rear cap 3. Each abutment member 24 consists of an extension of the border wall 6 that is produced at the intersection of the border wall 6 and the corresponding plate 19.

Figure 6:
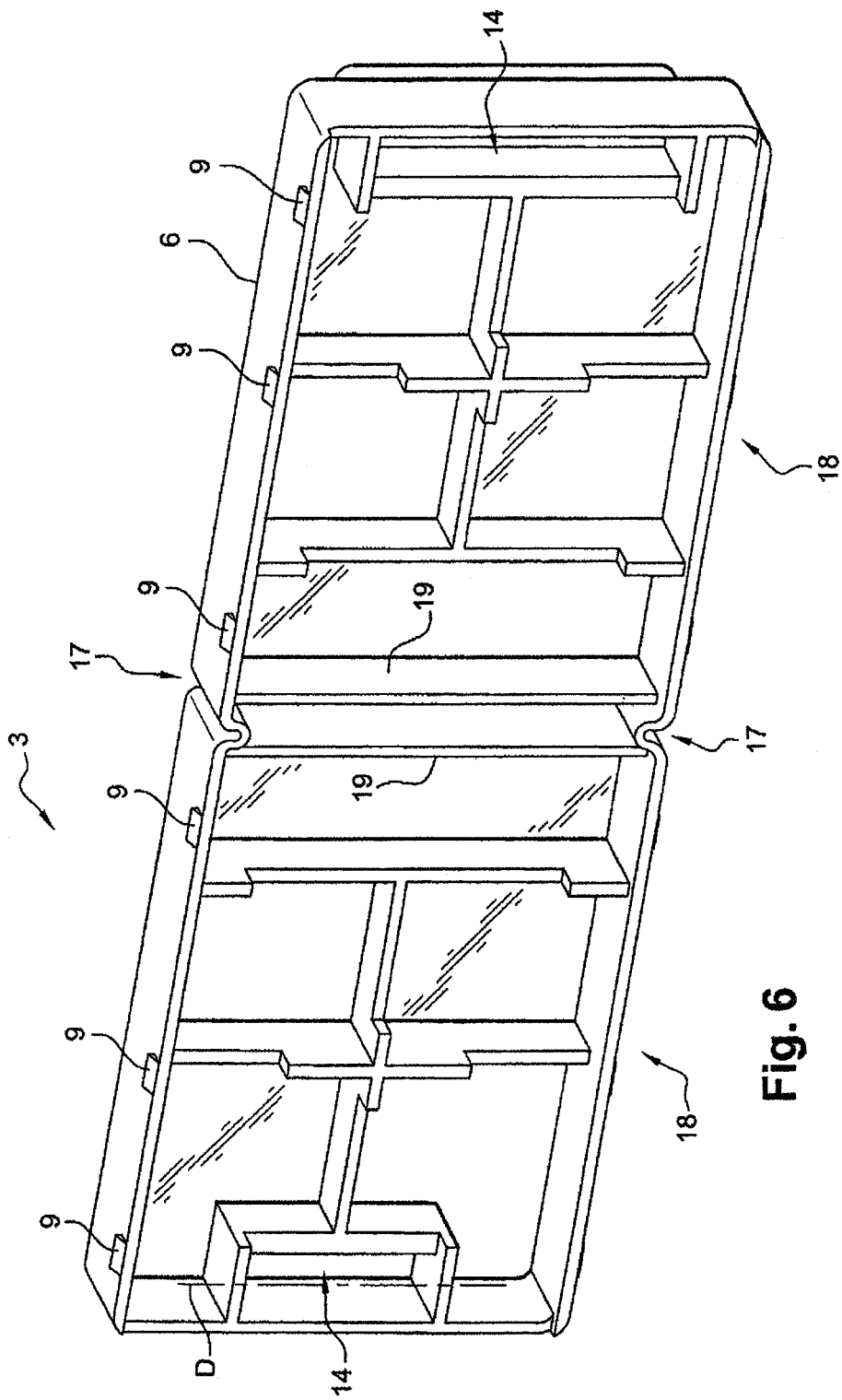
FIG. 6 is a diagrammatic perspective view of a rear cap of a third embodiment of the present invention.

In the third embodiment shown in FIG. 6, there is a plurality of pleats 17 in the border wall 6 of the rear cap 3. More particularly, there are two pleats 17 facing each other in two opposed edges 20 of the border wall 6.

The invention claimed is:

1. A housing for protecting an electronic device configured to be fitted to a motor vehicle, the housing comprising: a plurality of shells forming a front and a cap assembled together to define jointly an enclosure for housing an electronic circuit card comprising remote connectors; and the cap comprising at least two elementary shells, wherein a first elementary shell of the at least two elementary shells comprises at least one mobility means molded into the first elementary shell, wherein the at least one mobility means connects the at least two elementary shells and allows relative movement thereof between the at least two elementary shells, and wherein the cap is formed in one piece, and has a length in a longitudinal direction, the at least two elementary shells are situated side-by-side, each comprising a window near an opposite edge of the cap for the passage of a remote connector out of the enclosure, and said at least one mobility means comprises an elastically deformable member that varies the length of the cap; a back wall that further comprises at least two protruding ribs that form a cruciform arrangement.

2. The housing as claimed in claim 1, wherein the elastically deformable member comprises at least one pleat between the at least two elementary shells.

3. The housing as claimed in claim 2, wherein the pleat is a shape of the Greek letter omega (Ω).

4. The housing as claimed in claim 1, wherein the at least one mobility means is placed one-third of the way along a length L of the cap.

5. The housing as claimed in claim 2, wherein the at least two elementary shells are provided with respective antagonistic abutment members opposing crushing of the pleat.

6. The housing as claimed in claim 5, further comprising a stiffener flange in line with the corresponding antagonistic abutment member.

7. The housing as claimed in claim 1, wherein the elastically deformable member is part of a back wall of the cap.

8. The housing as claimed in claim 7, wherein the elastically deformable member is part of a border wall of the cap.

9. The housing as claimed in claim 8, wherein the border wall comprises at least two facing edges, wherein a first edge includes a first pleat facing a second pleat on the second edge.

10. The housing as claimed in claim 2, wherein a thickness of the pleat is between 60% and 85% inclusive of a thickness of the wall in which the pleat is formed.

11. The housing as claimed in claim 2, further comprising a plurality of pleats, wherein two successive pleats of the plurality of pleats are positioned head-to-tail relative to each other.

12. The housing as claimed in claim 1, wherein the electronic circuit card is for controlling the use of at least one selected from the group consisting of a ventilation, heating, and air conditioning installation.

13. The housing as claimed in claim 1, wherein the mobility means allows relative movement thereof between the at least two elementary shells in a substantially planar direction.

14. The housing as claimed in claim 2, wherein the pleat is a shape of the alphabet M.

* * * * *